US012635247B2

(12) United States Patent
Wang et al.

(10) Patent No.: US 12,635,247 B2
(45) Date of Patent: May 19, 2026

(54) ARRAY SUBSTRATE, DISPLAY PANEL AND METHOD FOR MANUFACTURING ARRAY SUBSTRATES

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Feng Wang, Beijing (CN); Feng Qu, Beijing (CN); Biqi Li, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 522 days.

(21) Appl. No.: 18/245,799

(22) PCT Filed: May 27, 2022

(86) PCT No.: PCT/CN2022/095480
§ 371 (c)(1),
(2) Date: Mar. 17, 2023

(87) PCT Pub. No.: WO2023/225984
PCT Pub. Date: Nov. 30, 2023

(65) Prior Publication Data
US 2025/0081606 A1      Mar. 6, 2025

(51) Int. Cl.
*H10D 86/60* (2025.01)
*H01Q 1/38* (2006.01)
(Continued)

(52) U.S. Cl.
CPC .............. *H10D 86/60* (2025.01); *H01Q 1/38* (2013.01); *H10D 86/021* (2025.01); *H10D 86/441* (2025.01)

(58) Field of Classification Search
CPC ......... H10D 86/60; H10D 86/021; H01Q 1/38
See application file for complete search history.

(56) References Cited

U.S. PATENT DOCUMENTS

| | | | |
|---|---|---|---|
| 6,411,258 | B1 | 6/2002 | Ho |
| 2004/0189625 | A1 | 9/2004 | Sato |
| | (Continued) | | |

FOREIGN PATENT DOCUMENTS

| | | |
|---|---|---|
| CN | 104466391 A | 3/2015 |
| CN | 105224136 A | 1/2016 |
| | (Continued) | |

OTHER PUBLICATIONS

Office Action received for Korea Patent Application No. KR1020247042297, mailed on Dec. 19, 2025, 5 pages.

*Primary Examiner* — Chad M Dicke
*Assistant Examiner* — Dave Tan
(74) *Attorney, Agent, or Firm* — Davé Law Group, LLC; Raj S. Davé

(57) ABSTRACT

The disclosure provides an array substrate, a display panel and a method for manufacturing an array substrate. The array substrate includes a substrate having a display area and a peripheral area around the display area; a first electrode provided on the substrate and disposed in the peripheral area; an opening disposed in the first electrode, wherein the opening passes through a surface of the first electrode away from the substrate and reaches a surface of the first electrode toward the substrate; a dielectric layer on the first electrode; and a conductive portion on the dielectric layer, wherein the conductive portion, the dielectric layer and the opening form an antenna.

18 Claims, 12 Drawing Sheets

(51) Int. Cl.
  *H10D 86/01*   (2026.01)
  *H10D 86/40*   (2025.01)

(56) References Cited

U.S. PATENT DOCUMENTS

| | | |
|---|---|---|
| 2012/0019419 A1 | 1/2012 | Prat et al. |
| 2014/0015724 A1* | 1/2014 | Bungo .................. H01Q 1/243 |
| | | 343/767 |
| 2017/0262120 A1 | 9/2017 | Liu et al. |
| 2018/0342810 A1 | 11/2018 | Yu et al. |
| 2020/0119445 A1* | 4/2020 | Misaki ................. H10D 86/441 |
| 2020/0185964 A1 | 6/2020 | Ren et al. |
| 2020/0295465 A1* | 9/2020 | Zhao ........................ H01Q 1/52 |
| 2021/0026178 A1 | 1/2021 | Wang et al. |
| 2021/0151474 A1 | 5/2021 | Cao et al. |
| 2022/0052133 A1 | 2/2022 | Yang et al. |

FOREIGN PATENT DOCUMENTS

| | | | | |
|---|---|---|---|---|
| CN | 106932947 A | 7/2017 | | |
| CN | 107067969 A | 8/2017 | | |
| CN | 108110427 A | 6/2018 | | |
| CN | 108963443 A | 12/2018 | | |
| CN | 208385618 A | 1/2019 | | |
| CN | 208401039 A | 1/2019 | | |
| CN | 109786396 A | 5/2019 | | |
| CN | 111610883 A | * 9/2020 | .............. | H01Q 1/50 |
| CN | 112259585 A | 1/2021 | | |
| CN | 113497343 A | 10/2021 | | |
| CN | 214336911 A | 10/2021 | | |
| CN | 113991299 A | 1/2022 | | |
| KR | 19990087366 A | 12/1999 | | |
| WO | 2021184372 A1 | 9/2021 | | |
| WO | WO-2021241962 A1 | * 12/2021 | .............. | H01Q 1/50 |

* cited by examiner

ARRAY SUBSTRATE, DISPLAY PANEL AND METHOD FOR MANUFACTURING ARRAY SUBSTRATES

CROSS REFERENCE TO RELATED APPLICATIONS

This patent application is a National Stage Entry of PCT/CN2022/095480 filed on May 27, 2022, the entire disclosure of which is hereby incorporated by reference herein in their entirety as part of the present application.

TECHNICAL FIELD

The present disclosure relates to a field of display technology. More specifically, it relates to an array substrate, a display panel, and a method of manufacturing an array substrate.

BACKGROUND

Further optimization of various microwave communication devices (such as transmission lines, waveguides, and antennas) has become a trend in mobile terminals (such as cell phones, laptops, car glass) and wireless applications (such as microsatellites, smart windows, and smart wearable devices), and thus brings new technical challenges.

SUMMARY

Some embodiments of the disclosure provide an array substrate.

In some embodiments of the disclosure, the array substrate include a substrate having a display area and a peripheral area around the display area, a first electrode disposed on the substrate and in the peripheral area, an opening disposed in the first electrode, wherein the opening passes through a surface of the first electrode away from the substrate and reaches a surface of the first electrode facing toward the substrate, a dielectric layer disposed on a side of the first electrode away from the substrate, and a conductive portion disposed on a side of the dielectric layer away from the substrate, and wherein the conductive portion, the dielectric layer and the opening form an antenna.

In some embodiments, the conductive portion includes a first sub-conductive portion and a second sub-conductive portion connected to the first sub-conductive portion, wherein a width of the first sub-conductive portion is greater than a width of the second sub-conductive portion, and wherein a projection of the first sub-conductive portion on the substrate overlaps with a projection of the opening on the substrate.

In some embodiments, the first sub-conductive portion and the second sub-conductive portion are arranged along an extension direction of the first electrode.

In some embodiments, the opening has a first opening portion and a second opening portion, a projection of the first opening portion on the substrate overlaps with a projection of the conductive portion on the substrate, and a projection of the second opening portion on the substrate does not overlap with a projection of the conductive portion on the substrate.

In some embodiments, wherein a width of the opening is between 40 microns~100 microns, and wherein a length of the opening is twice a length of the first sub-conductive portion.

In some embodiments, a distance between a projection of the opening on the substrate to a projection of the second sub-conductive portion on the substrate is less than or equal to a width of the second sub-conductive portion.

In some embodiments, a ratio of the width of the first sub-conductive portion to the width of the second sub-conductive portion is between 2~4.

In some embodiments, the width of the first sub-conductive portion is 120 microns and the width of the second sub-conductive portion is 30 microns.

In some embodiments, the array substrate includes at least two openings and at least two conductive portions corresponding to at least two openings, respectively, wherein the at least two conductive portions are electrically connected through corresponding second sub-conductive portions.

In some embodiments, a distance from a center of one of the at least two the openings to a center of the opening adjacent thereto is between 4 mm~10 mm.

In some embodiments, the array substrate further includes an RF control circuit disposed on a surface of the substrate opposite a surface of the substrate on which the first electrode is provided, and a feed line connected to the conductive portion, the feed line being used to electrically connect the conductive portion and the RF control circuit.

In some embodiments, wherein the substrate further includes a bonding area disposed in the peripheral area, wherein the feed line extends to the bonding area.

In some embodiments, the opening and the bonding area are on a same side of the array substrate as the bonding area.

In some embodiments, the feed line includes a coplanar waveguide.

In some embodiments, the at least two conductive portions are located on a same side of the feed line.

In some embodiments, the at least two conductive portions are on different sides of the feed line.

In some embodiments, a distance from the opening to a side of the first electrode away from the display area is greater than 100 microns, and a distance from the opening to a side of the first electrode facing toward the display area is greater than 100 microns.

In some embodiments, the array substrate further includes at least one pixel unit disposed in the display area, and a common electrode disposed on the at least one pixel unit, wherein the first electrode and the common electrode are electrically connected.

In some embodiments, the array substrate further includes a first conductive layer disposed on the first electrode, wherein the opening exposes a surface of the first conductive layer away from the substrate and a surface of the first conductive layer facing toward the substrate, wherein the common electrode has a first portion and a second portion, a projection of the first portion on the substrate overlaps with a projection of the first conductive layer on the substrate, wherein the first portion is in contact with the first conductive layer, and wherein a thickness of the first portion is greater than or equal to a thickness of the second portion.

In some embodiments, the array substrate further includes a first conductive layer disposed on a side of the first electrode away from the substrate, wherein the opening exposes a surface of the first conductive layer away from the substrate and a surface of the first conductive layer facing toward the substrate, and wherein a thickness of the first conductive layer is greater than or equal to a thickness of the anode.

In some embodiments, the at least two openings include two or more groups of openings, wherein conductive portions corresponding to openings in a same group of openings are connected to a same feed line, and conductive portions corresponding to different groups of openings are connected to different feed lines.

In some embodiments, the at least two openings include a first sub-opening set and a second sub-opening set, wherein the first sub-opening set is on a first side of the array substrate and the second sub-opening set is on a second side of the array substrate adjacent to the first side, wherein the conductive portions corresponding to the first sub-opening set and the conductive portions corresponding to the second sub-opening set are electrically connected.

In some embodiments, a difference between a distance from the second sub-opening set to the second sub-conductive portion corresponding to the first sub-opening set and a distance from the first opening set to the second sub-conductive portion corresponding to the second sub-opening set is an odd multiple of $\lambda/4$, wherein $\lambda$ is a wavelength of electromagnetic waves with an operating frequency band of the antenna in an equivalent medium of the array substrate.

In some embodiments, the array substrate further includes a heat sink layer on a surface of the substrate opposite to a surface of the substrate on which the first electrode is provided, an additional substrate layer between the substrate and the heat sink layer, wherein the additional substrate layer satisfies at least one of the following:

an absorption for millimeter band electromagnetic waves by the additional substrate layer is greater than an absorption for the electromagnetic waves by the substrate; and a refractive index for millimeter band electromagnetic waves by the additional substrate layer is greater than a refractive index for the electromagnetic waves by the substrate.

In some embodiments, the array substrate further includes a heat sink layer disposed on a surface of the substrate opposite to a surface of the substrate on which the first electrode is provided;

an additional opening in the heat sink layer, wherein a projection of the additional opening on the substrate overlaps at least partially with a projection of the opening on the substrate.

In some embodiments, the array substrate further includes a heat sink layer on a surface of the substrate opposite to a surface of the substrate on which the first electrode is provided, wherein the heat sink layer is provided with an artificial magnetic conductor on a surface facing toward the substrate, and wherein the artificial magnetic conductor is used to change a phase of a magnetic field of electromagnetic waves leaving therefrom while stabilizing a phase of its electric field.

Some embodiments of the disclosure also provide a display panel. The display panel includes an array substrate as described above.

Some embodiments of the disclosure also provide a method for manufacturing an array substrate. The method includes providing a substrate, the substrate having a display area and a peripheral area around the display area, providing a first electrode on the peripheral area of the substrate, providing an opening in the first electrode, wherein the opening passes through a surface of the first electrode away from the substrate and a surface of the first electrode facing toward the substrate, providing a dielectric layer on a side of the first electrode away from the substrate, and providing a conductive portion on a side of the dielectric layer away from the substrate.

DRAWINGS

In order to more clearly illustrate the technical solutions of embodiments of the presently disclosure, a brief description of the accompanying drawings of the embodiments will be given below, and it should be understood that the accompanying drawings described below relate only to some embodiments of the disclosure and are not a limitation of the disclosure, wherein.

DETAILED DESCRIPTION

Figure 1:
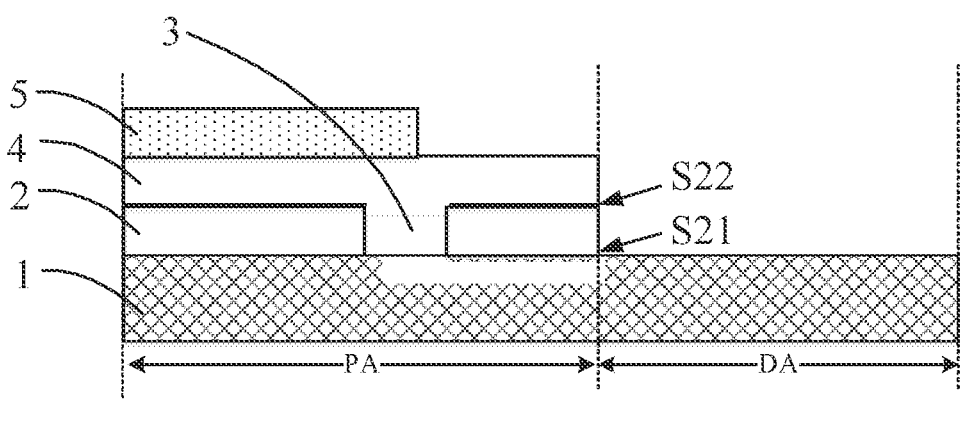
FIG. 1 is a schematic view of an array substrate according to an embodiment of the present invention.

The technical solutions in the embodiments of the present disclosure will be more clearly and more completely described in conjunction with the drawings in the embodiments of the present disclosure. It is obvious that the described embodiments are only a part of the embodiments of the present disclosure, and not all of the embodiments. All other embodiments obtained by a person of ordinary skill in the art based on the embodiments of the present disclosure without departing from the inventive scope are in the scope of the disclosure.

When introducing elements of the presently disclosure and embodiments thereof, the terms "one", "a", "the" and "said" are intended to indicate the presence of one or more elements Similarly, the words "comprise", "comprises", and "comprising" are to be interpreted inclusively rather than exclusively, and indicate that additional elements other than those listed may be present.

For purposes of the description hereinafter, the terms "upper", "lower", "right", "left", "vertical", "horizontal", "top", "bottom", and derivatives thereof shall relate to the invention disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In recent years, 2G/3G/4G, Bluetooth, WIFI (Wireless Fidelity), GPS (Global Positioning System), BDS (BeiDou Navigation Satellite System), NFC (Near Field Communication), wireless charging and other frequency bands of cell phone terminals occupy most of the antenna clearance area, resulting difficulties in the deployment of 5G millimeter wave antennas on cell phone terminals, and the antenna structure of existing terminals can not meet the requirements of simultaneous coverage of 5G millimeter wave multiple use frequency bands. In addition, 5G millimeter wave propagation loss is large, and in order to ensure antenna gain, the antennas need to be arrayed, which requires more space to line up the antennas.

In one implementation, the antenna can be set on a flexible film, and then the flexible film is attached to a screen. However, due to the limitation of alignment accuracy of the lamination process, such an approach tends to produce shield of display pixels, resulting in undesired dark lines and moiré stripes. In addition, to passivate the optical transmittance degradation effect caused by the antenna formation area, a grid pattern structure similar to that of the antenna functional area needs to be formed in the non-antenna functional area as well, which also results in a 5% to 20% decrease in the transmittance of the plane.

If a method similar to the integration of touch panel on the OLED package layer is used directly, although the precise alignment in the semiconductor process can be used, but due to the low height of the package layer from the cathode of the OLED, which is usually 10-15 microns, according to the microstrip patch radiation theory, the antenna of such solution can only have a radiation efficiency of about 2.8%. Therefore, it is basically not feasible to make antennas, especially millimeter wave antennas, by such solution.

FIG. 1 shows a schematic view of an array substrate according to an embodiment of the present disclosure. As shown in FIG. 1, the array substrate according to an embodiment of the present disclosure includes: a substrate 1 having a display area DA and a peripheral area PA around the display area DA; a first electrode 2 disposed on the substrate 1 and located in the peripheral area PA; an opening 3 disposed in the first electrode 2, wherein the opening 3 passes through a surface S22 of the first electrode 2 away from the substrate 1 and reaches a surface S21 of the first electrode 2 toward the substrate 1; a dielectric layer 4 disposed on a side of the first electrode 2 away from the substrate; a conductive portion 5 disposed on a side of the dielectric layer 4 away from the substrate, and wherein the conductive portion 5, the dielectric layer 4, and the opening 3 form an antenna.

For conventional slot antennas, the thickness of the dielectric layer between the metal ground slit and the feed line is generally designed to be between $0.01\lambda0$ and $0.1\lambda0$, and the dimensions of the metal ground are generally required to be larger than $\lambda0$ in both orthogonal directions, wherein $\lambda0$ is the wavelength of electromagnetic waves with the antenna's operating frequency band in vacuum. Due to the limitation of such dielectric layer thickness, it is usually considered difficult to apply the slot antenna to the display. However, the inventors have overcome the conventional technical design. The inventors have found that for a slot antenna, the thickness of the dielectric layer between its metal ground and the feed line could be reduced to an order of magnitude that can be integrated into the array substrate, such as $0.001\lambda0$ order of magnitude, such thickness has little effect on the radiation efficiency of the slot antenna, and the width of the metal ground in the direction perpendicular to the length of the slot can be compressed to between $0.04\lambda0$ and $0.1\lambda0$.

Embodiments of the disclosure can provide a microstrip slot antenna having a smaller size than a conventional antenna (e.g., a patch antenna) attached to an array substrate. For example, the slot antenna of some embodiments of the disclosure can be reduced in size by 50% to 90% compared to a conventional patch antenna.

In existing design for antennas of array substrates, the optical transmittance of the display area can only reach 80% to 90% due to the influence of alignment accuracy and the formation of a grid pattern structure similar to that of the antenna functional area in the non-antenna functional area as well. However, in an embodiment of the disclosure, since the antenna is formed in the peripheral area of the array substrate rather than in the display area, it has no effect on the light transmission in the display area, thereby significantly improving the light transmission rate in the display area of the array substrate.

Further, in the conventional design of the antenna of the array substrate, the antenna is first fabricated on the flexible film and then the flexible film is laminated to the screen, making the screen increase in thickness by more than one hundred microns. This is not conducive to the thinness and flexibility of the screen. Unlike the conventional design of patch antenna, in embodiments of this disclosure, it is possible to form the antenna integrally with the array substrate, thus essentially not increasing the thickness of the array substrate, which is conducive to the thinness and lightness of the screen, and has no bad effect on functions such as folding and bending.

Existing patch-type on-screen antennas are limited by the limited distance from the antenna to the pixel circuit, and the radiation efficiency is usually below 40%. Besides, the size of the patch antenna is large and the patch antenna needs to be made within the display area or at least partially in the display area. This requires a mesh-based patch design and minimizes the metal line width of the mesh in order to ensure less shield of the display pixels in the display area. This increases the manufacturing cost of the antenna and also reduces the radiation performance of the antenna. The antenna of some embodiments of the present disclosure can avoid the above disadvantages, increase the radiation efficiency, and also has an advantage in manufacturing cost.

Figure 2:
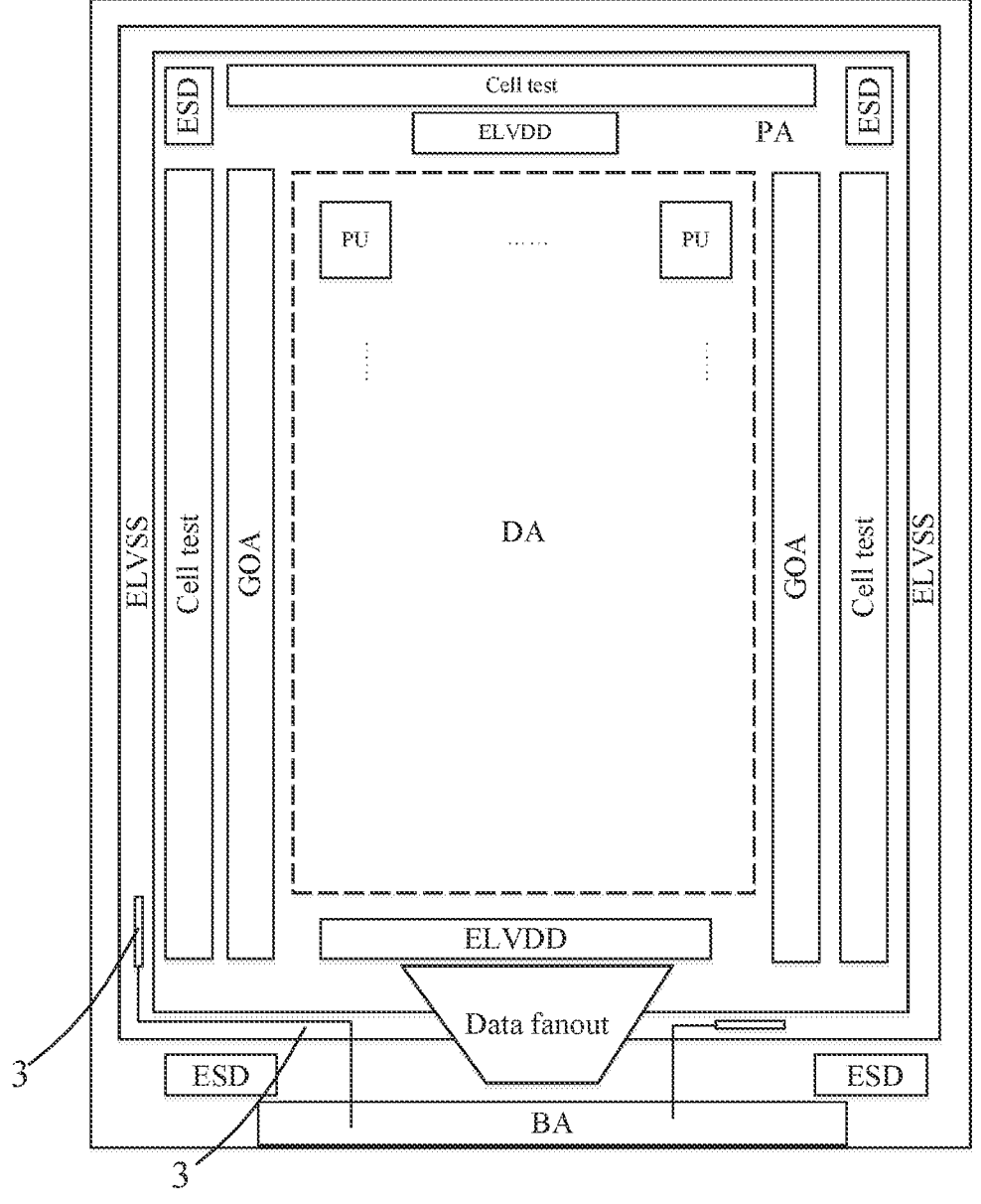
FIG. 2 is a schematic top view of an array substrate according to an embodiment of the disclosure.
Figure 3:
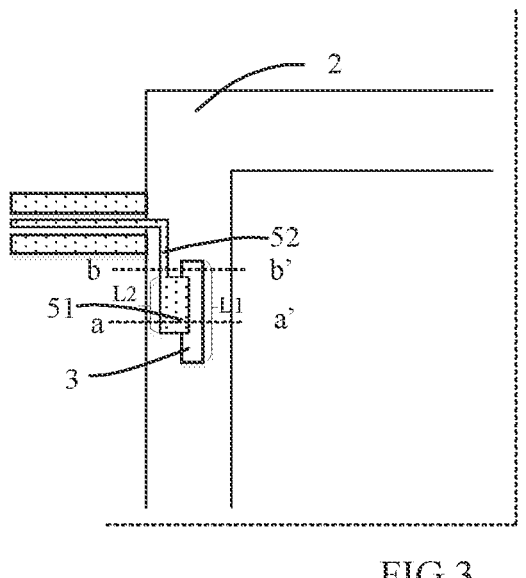
FIG. 3 is a partial top-view schematic view of an array substrate according to an embodiment of the disclosure.

FIG. 2 shows atop view schematic view of the array substrate according to an embodiment of the present disclosure. FIG. 3 shows a partial top view of the array substrate according to an embodiment of the present disclosure. In some embodiments, for example, referring to FIG. 2, the first electrode 2 may be used as an ELVSS electrode line for powering the pixel circuitry. Compared to the display area DA (which is also often referred to as the AA area), which has a large amount of wiring of the pixel driver circuit, such as data lines, scan lines, control lines, etc., the first electrode (e.g., ELVSS electrode line) located above the peripheral area PA is relatively "clean" and free of complicated wiring.

Therefore, it is easier to set the opening of the slot antenna in the first electrode, such as ELVSS electrode line and this solution has an advantage in production cost.

As shown in FIG. 3, the conductive portion 5 can include a first sub-conductive portion 51 and a second sub-conductive portion 52 connected to the first sub-conductive portion. The width of the first sub-conductive portion 51 is greater than the width of the second sub-conductive portion 52. And wherein a projection of the first sub-conductive portion 51 on the substrate 1 overlaps with a projection of the opening 3 on the substrate 1. By such a first conductive portion, the radiation efficiency of the antenna is ensured. The standard transmission line impedance (e.g., 50 ohms) can be ensured by such a setting of the second conductive portion. Therefore, such a conductive portion can not only ensure the radiation efficiency of the antenna, but also match with the standard transmission line impedance.

As shown in FIG. 3, the first sub-conductive portion 51 and the second sub-conductive portion 52 can be "longitudinally arranged", i.e., they can be arranged along an extension direction of the first electrode 2. It should be noted that "longitudinal" here means along the extension direction of the first electrode, and "transverse" means along the direction perpendicular to the extension direction of the first electrode. For example, as shown later in FIG. 14, the first sub-conductive portion and the second sub-conductive portion are also called "longitudinally aligned" not only for the portion of the electrodes located on the left and right sides of the array substrate of FIG. 14, but also for the portion of the first electrode located on the upper side of the array substrate of FIG. 14.

This "longitudinal alignment" of the first and second sub-conductive portions can optimize the radiation efficiency of the slot antenna while meeting the requirements of a narrow bezel design. For example, for the example of the first electrode being used as ELVSS, although the width of the ELVSS itself is only between 100 μm-300 μm, narrow openings can be excavated on the ELVSS, where the width of the opening is between a few tens of microns to 100 microns, so as to meet the requirement of high radiation efficiency. If the first sub-conductive portion and the second sub-conductive portion are arranged "transversely" (i.e., in a direction perpendicular to the extension direction of the first electrode), a wide width of the first electrode is required to ensure the radiation efficiency of the antenna, which will limit its application in narrow bezel designs.

It should be noted that although the first sub-conductive portion 51 is shown as a rectangle in the figure for illustrative purposes, it is also possible to set the first sub-conductive portion to have other shapes according to practical needs. For example, in some embodiments, the first sub-conductive portion can be set to have a trapezoidal shape or to have a circular shape.

Figure 4:
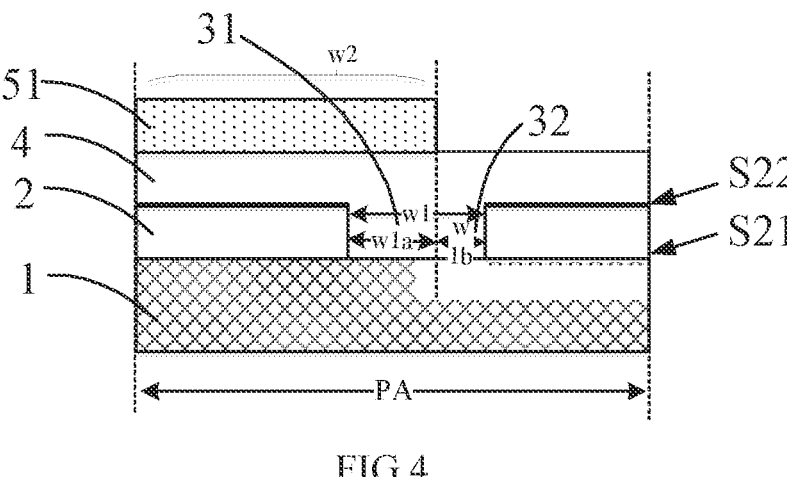
FIG. 4 is a schematic local cross-sectional view of the array substrate illustrated in FIG. 3 along line aa'.

FIG. 4 shows a schematic view of a partial cross section of the array substrate illustrated in FIG. 3 along the aa' line. As shown in FIG. 4, in some embodiments, the opening 3 located in the first electrode 2 has a first opening portion 31 and a second opening portion 32. A projection of the first opening portion 31 on the substrate 1 overlaps with a projection of the conductive portion 5 on the substrate 1. A projection of the second opening portion 32 on the substrate 1 does not overlap with the projection of the conductive portion 5 on the substrate 1. By such an arrangement, it is also possible to optimize the radiation efficiency of the antenna.

As shown in FIG. 4, the width of the first opening portion 31 is noted as w1a and the width of the second opening portion 32 is noted as w1b. A change in the ratio of the width w1a of the first opening portion to the width w1b of the second opening portion causes a change in the peak frequency of the radiation of the antenna.

Figures 5, 6:
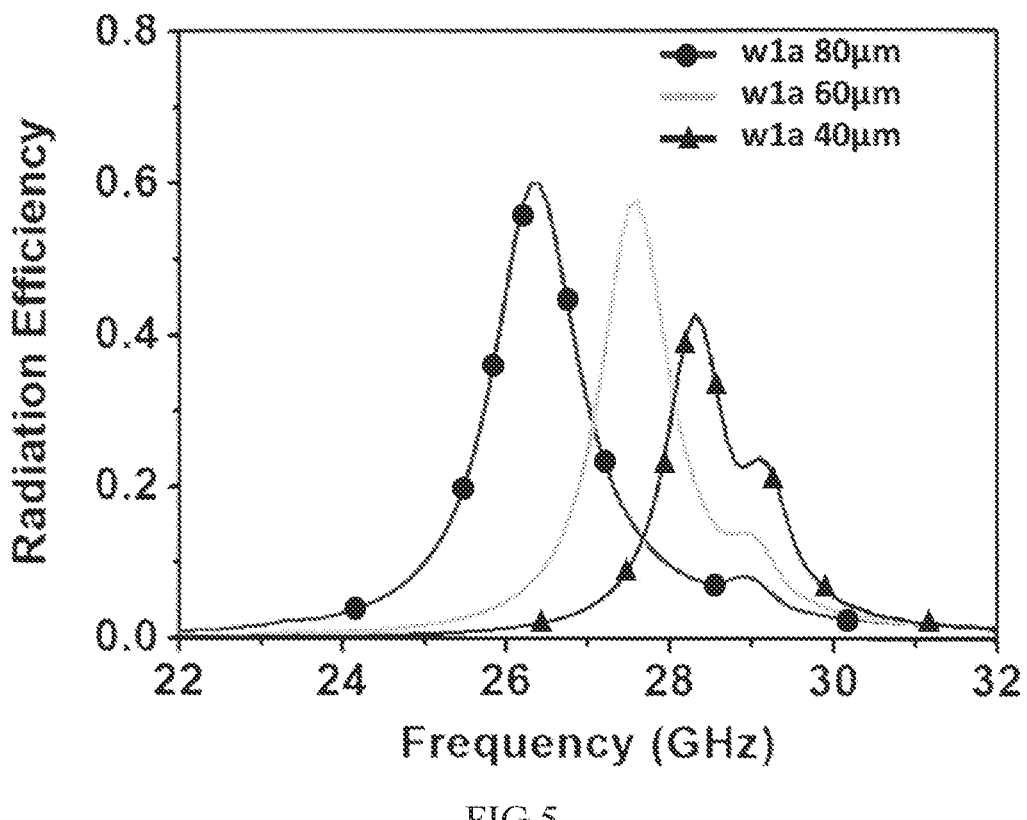
FIG. 5 is a schematic diagram of a radiation efficiency of an antenna according to an embodiment of the disclosure.
FIG. 6 is a schematic view of a local cross-section of the array substrate illustrated in FIG. 3 along the line bb'.

FIG. 5 shows a schematic diagram of the radiation efficiency of an antenna according to an embodiment of the disclosure. Assuming that the width w1 of the opening 3 is 100 microns, in FIG. 5, we can see that as the width w1a of the first opening portion decreases from 80 microns to 60 microns and to 40 microns respectively (that is, the width w1b of the second opening portion increases from 20 microns to 40 microns and to 60 microns respectively), the radiation band of the antenna undergoes a significant blue shift. However, they all achieve a radiation efficiency of 40% to more than 50%. Thus, the array substrate of the embodiments of the disclosure has good antenna efficiency.

In some embodiments, the width w1 of the opening 3 can be between at about 40 microns to 100 microns. In some embodiments, the length L1 of the opening may be approximately twice the length L2 of the first sub-conductive portion, as shown in FIG. 3. Such arrangement is particularly suitable for the millimeter band around 25-30 GHz and can be applicable in the 5G field.

In some embodiments, the dielectric layer 4 may completely fill the opening 3. In other embodiments, the dielectric layer 4 may also partially fill the opening 3. In yet other embodiments, the dielectric layer 4 may not fill the opening 3.

FIG. 6 shows a schematic view of a partial cross section of the array substrate illustrated in FIG. 3 along the bb' line. As shown in FIG. 6, the width of the second sub-conductive portion 52 is denoted as w0, and the distance from the second sub-conductive portion to the opening 3 including the first opening portion 31 and the second opening portion 32 (i.e., the distance from the projection of the second sub-conductive portion on the substrate to the projection of the opening on the substrate) is denoted as g. Generally, the smaller the g is, the stronger the coupling from the conductive portion to the opening is, and the higher the radiation efficiency of the antenna is. Thereby, if process accuracy is possible, g can be made as close to zero as possible. The inventors have found that making the distance between the projection of the opening on the substrate to the projection of the second sub-conductive portion on the substrate less than or equal to the width of the second sub-conductive portion (i.e., taking g≤w0) ensures stronger coupling radiation.

The inventors found that the ratio of the width w2 of the first sub-conductive portion 51 to the width w0 of the second sub-conductive portion 52 can be set between about 2~4, which can achieve a better S11 and a better peak radiation efficiency. For the application frequency of 25-30 GHz, the width w0 of the sub-conductive portion 52 can be set to 40 microns and the width w2 of the first sub-conductive portion 51 can be set to 120 microns.

Figure 7:
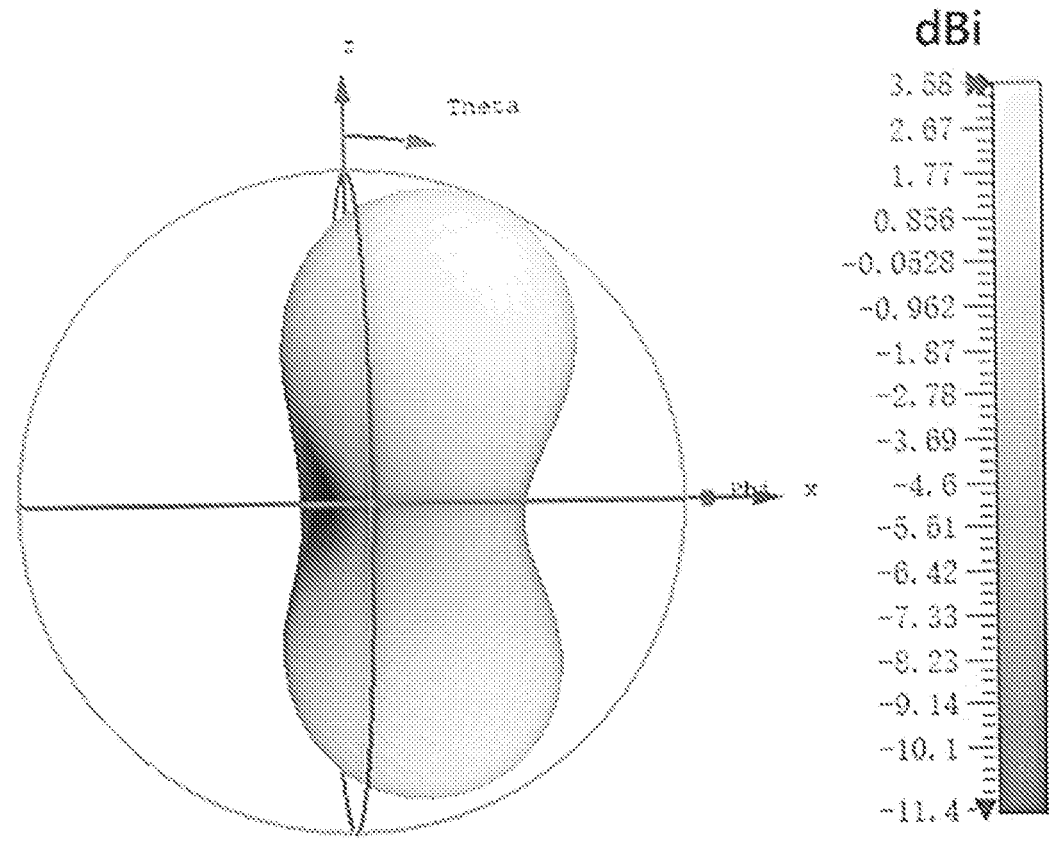
FIG. 7 is a gain diagram of an antenna of an array substrate according to some embodiments of the disclosure.

FIG. 7 shows a gain diagram of an antenna of an array substrate according to some embodiments of the disclosure. FIG. 7 shows as an example that the width w1 of the opening is 100 microns and the width of the first opening portion is 70 microns. As can be seen in FIG. 7, the radiation gain of a single antenna can be as high as 3 dBi for a 31.3 GHz wave.

Figure 8:
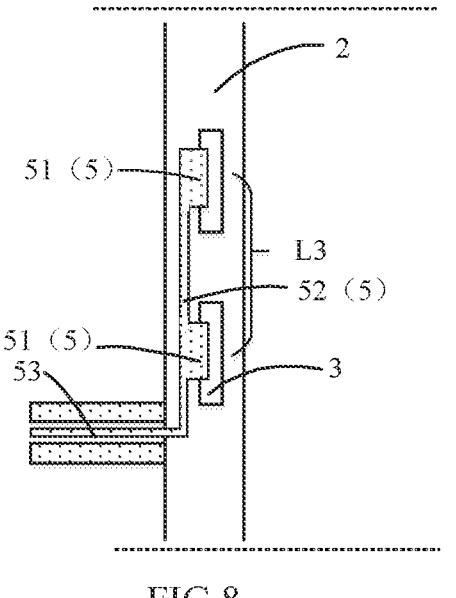
FIGS. 8-FIG. 9 are schematic views of an array substrate according to some embodiments of the disclosure.
Figure 9:
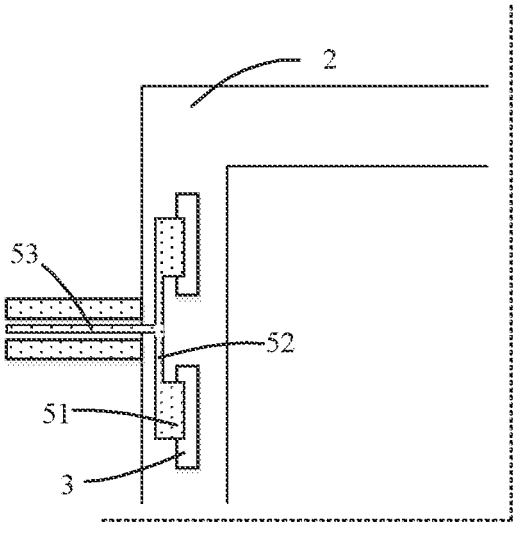

FIGS. 8-FIG. 9 show schematic views of an array substrate according to some embodiments of the disclosure. As shown in FIGS. 8-FIG. 9, the array substrate can include at least two openings and at least two conductive portions corresponding to each of the two openings, wherein the at least two conductive portions are electrically connected through corresponding second sub-conductive portions. This enables the formation of a slot antenna array. The number of openings is not limited here, for example, it can be two, three, four or more.

In order to obtain good radiation gain of the antenna array, the distance L3 from a center of one of the at least two openings to a center of the opening adjacent to it can be optimized. L3 can be taken as λ/n, where λ is the wavelength of electromagnetic waves with the operating band of the antenna in air and in vacuum, and n is the effective medium refractive index of the antenna. The distance from the center of one of at least two openings to the center of the opening adjacent to it is set between about 4~10 mm to obtain a good radiation gain of the antenna array.

Figure 10:
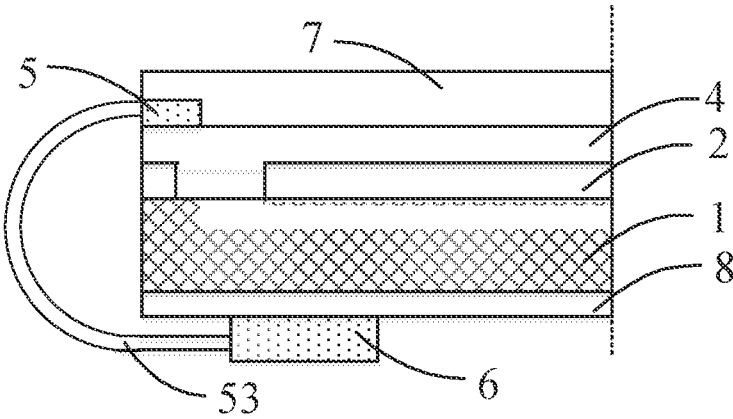
FIG. 10 is a schematic view of a partial cross-section of an array substrate according to embodiments of the disclosure.

FIG. 10 shows a schematic view of a partial cross-section of an array substrate according to an embodiment of the disclosure. As shown in FIG. 10, the array substrate may also include an RF control circuit 6 disposed on a surface of the substrate opposite to a surface of the substrate provided with the first electrode 2, and a feed line 53 connected to the conductive portion 5 for electrically connecting the conductive portion 2 and the RF control circuit 6. The feed line 53 may include a coplanar waveguide.

In some embodiments, the array substrate may also be provided with an overlay layer 7 on a surface of the conductive portion away from the substrate 1. The specific type of overlay layer may be provided as desired. For example, the overlay layer may include a polarization layer, an OCA bonding layer, or an overlay glass layer.

Referring to FIG. 8, at least two conductive portions 5 may be located on the same side of the feed line 53. In other embodiments, as shown in FIG. 9, at least two conductive portions 5 are located on different sides of the feed line 53.

For the two embodiments where the conductive portions are located on the same side of the feed line and where the conductive portions are located on different sides of the feed line, the resulting antenna radiation efficiencies as well as the antenna gains do not differ much. However, if the feed line is not located in the middle of multiple antennas to feed from the middle, there will be a certain phase difference between different antennas. Such a phase difference will not only cause the radiation beam deflection, but also cause the antenna gain decline. Thereby, if the antenna is two or more, as shown in FIG. 9, the feed line can also be fed from the middle of multiple antennas to ensure a maximum radiation efficiency and gain.

In some embodiments, the distance w3a from the opening to a side of the first electrode away from the display area may be greater than 100 microns. In other embodiments, the distance w3b from the opening to a side of the first electrode facing toward the display area may be greater than 100 microns. This ensures that the radiation efficiency of the antenna is not affected by the narrow second electrode (e.g., ELVSS electrode) line width.

Figures 11, 12:
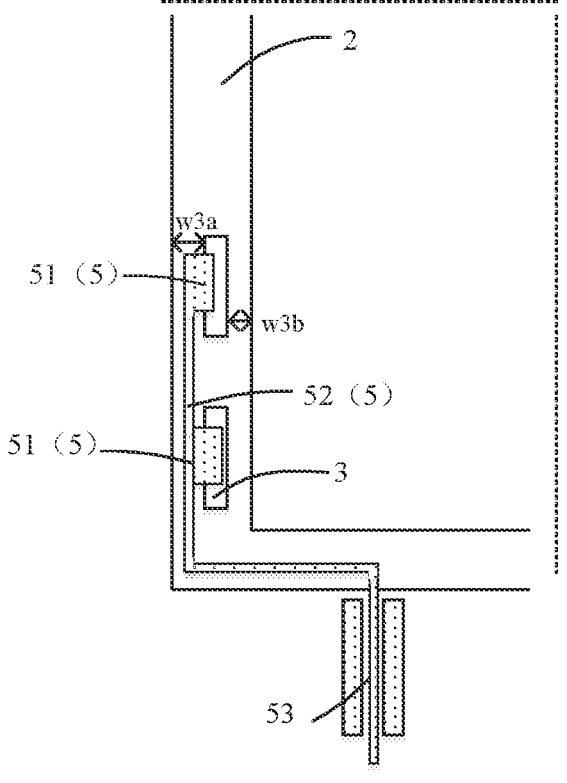
FIG. 11 is a partial top view of an array substrate according to embodiments of the disclosure.
FIG. 12 is a schematic view of a partial cross-section of an array substrate according to an embodiment of the disclosure.

FIG. 11 shows a partial top view of the array substrate according to an embodiment of the disclosure. Referring to FIG. 2 and FIG. 11, in some embodiments, the substrate of the array substrate may also include a fan-out area (Data fanout area) and a bonding area (bonding area BA) located in the peripheral area PA, where the feed line extends to the bonding area. Since the fanout area and bonding area of the array substrate originally correspond to the bending area, and no additional bending area is required to electrically connect the antenna to the RF chip of the array substrate, thus such an arrangement does not additionally increase the need for the screen bezel width, which is advantageous for use in narrow bezel designs or bezel-less designs. Further, the opening 3 can be set to be located on the same side as the binding area is located on the array substrate. This can achieve better performance of the array substrate.

Figure 13:
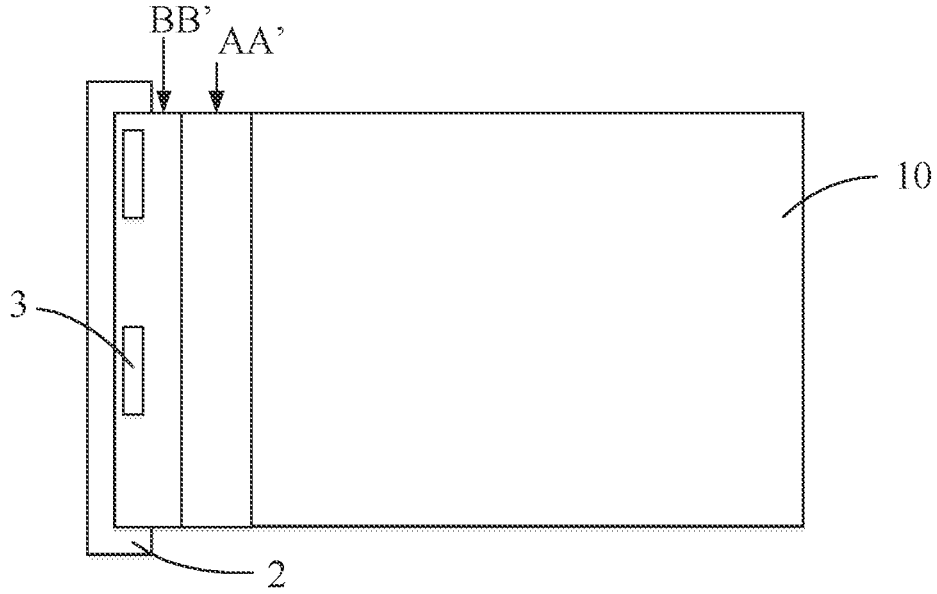
FIG. 13 is a schematic view of an array substrate according to an embodiment of the disclosure.

FIG. 12 is a partial cross-sectional schematic view of an array substrate according to an embodiment of the disclosure. FIG. 13 shows a top view of the array substrate of FIG. 12. As shown in FIG. 12, the array substrate may also include a first conductive layer 9 disposed on a side of the first electrode 2 away from the substrate, and the opening 3 also exposes a surface of the first conductive layer 9 away from the substrate 1 and a surface of the first conductive layer 9 toward the substrate 1. The common electrode 10 may have a first portion 101 and a second portion 102, wherein the projection of the first portion 101 on the substrate 1 overlaps with the projection of the first conductive layer 9 on the substrate, and the first portion 101 is in contact with the first conductive layer 9, and wherein the thickness of the first portion 101 is greater than or equal to the thickness of the second portion 102. For example, the thickness of the second portion 102 can be 10-15 nm, and the thickness of the first portion 101 can be 600 nm or more. By such an arrangement, the radiation efficiency of the antenna can be further increased.

In some embodiments of the disclosure, the array substrate may further include at least one pixel unit PU located in the display area DA (see, for example, FIG. 2) and a common electrode 10 located on the at least one pixel unit PU (see FIG. 12), wherein the first electrode 2 and the common electrode 10 are electrically connected. The common electrode may be the cathode of the pixel unit.

Referring to FIG. 12, the pixel unit PU may include an anode 12, a light-emitting pixel layer 13, and a cathode 10 as the common electrode. The cathode may include an MgAg alloy to ensure optical transmittance.

In some embodiments, the anode 12 may be provided in the same layer as the first conductive layer 9, and the thickness of the first conductive layer 9 may be set to be greater than or equal to the thickness of the anode 12. Such an arrangement can also increase the radiation efficiency of the antenna. The material of the first conductive layer 9 can include at least one of the following: Ag, Cu, Al and other high electrical conductivity metal materials.

In some embodiments, the first conductive layer 9 can be provided in the same layer with the anode 12 of the display unit. The opening 3 may satisfy one of the following: 1) partially filled by the dielectric layer 4; 2) completely filled by the dielectric layer 4; and 3) not filled by the dielectric layer 4. The dielectric layer 4 may be a planarization layer for covering the TFT area 15.

FIG. 13 shows a schematic view of an array substrate according to an embodiment of the disclosure. As shown in FIG. 13, it is also possible to set the thickness of the first portion 101 greater than or equal to the thickness of the second portion 102 (see the cathode thickening area AA' marked in FIG. 13) while also setting the thickness of the first conductive layer 9 greater than or equal to the thickness of the anode 12 (see the anode thickening area BB' marked in FIG. 13).

In some embodiments, the openings may include two or more groups of openings, wherein the conductive portions corresponding to the openings in the same group of openings are connected to a same feed line and the conductive portions corresponding to different groups of openings are connected to different feed lines.

Figure 14:
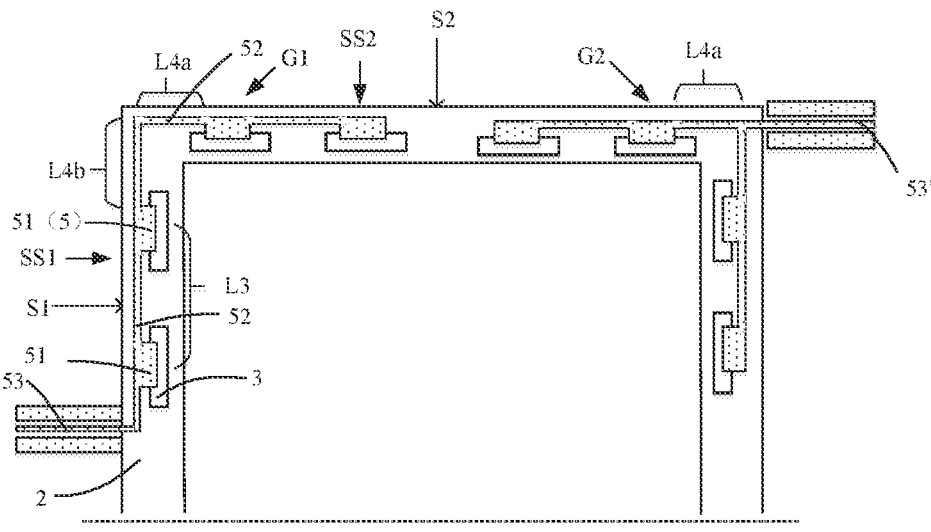
FIG. 14 is a schematic view of an array substrate according to an embodiment of the disclosure.

FIG. 14 shows a schematic view of an array substrate according to an embodiment of the disclosure. As shown in FIG. 14, the openings may include at least a first opening group G1 and a second opening group G2, wherein the conductive portions corresponding to the first opening group and the conductive portions corresponding to the second opening group are connected to different feed lines. As shown in FIG. 14, the conductive portions corresponding to the first opening group are connected to the feed line 53, while the conductive portions corresponding to the second opening group are connected to the feed line 53'. Of course, the openings can also be set to include three or more opening groups, as desired. By doing so, a plurality of antennas operating in different frequency bands can be formed.

As shown in FIG. 14, for either group of opening, the openings therein may include a first sub-opening set SS1 and a second sub-opening set SS2, wherein the first sub-opening set is provided on a first side S1 of the array substrate, and the second sub-opening set is provided on a second side S2 of the array substrate adjacent to the first side S1, wherein the conductive portions corresponding to the first sub-opening set and the conductive portions corresponding to the second sub-opening set are electrically connected. By such an arrangement, a bipolar design can be realized.

In some embodiments, the difference between the distance from the second sub-opening set SS2 to the second sub-conductive portion 52 corresponding to the first sub-opening set SS1 and the distance from the first opening set SS1 to the second sub-conductive portion 52 corresponding to the second sub-opening set SS2 is an odd multiple of about λ/4, where λ is the wavelength of the electromagnetic wave with the operating band of the antenna in the equivalent medium of the array substrate. For example, for 5G applications, the operating band of the antenna may be the millimeter band. Such an arrangement enables the formation of circularly polarized radiation at the corner locations of the array substrate.

Figure 15:
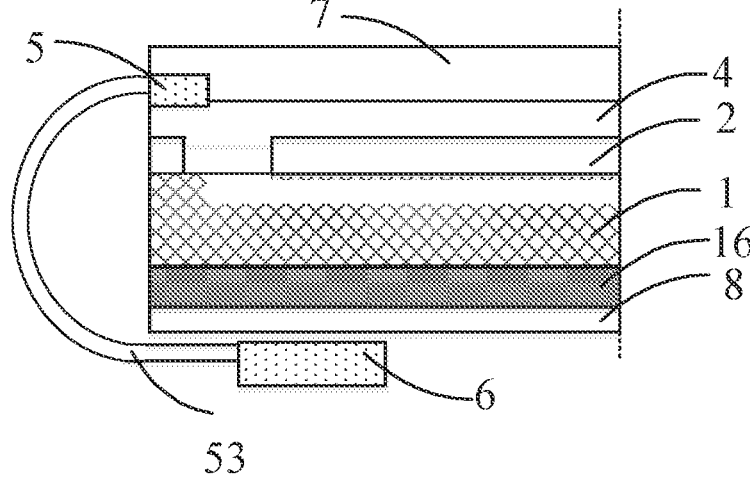
FIG. 15 is a schematic view of a cross-section of an array substrate according to an embodiment of the disclosure.

FIG. 15 shows a schematic cross-section view of an array substrate according to an embodiment of the disclosure. As shown in FIG. 15, the array substrate may include a heat sink layer 8 on a surface of the substrate opposite a surface of the substrate provided with a first electrode, and an additional substrate layer 16 between the substrate 1 and the heat sink layer 8. Wherein the additional substrate layer 16 satisfies at least one of the following: an absorption for millimeter band electromagnetic waves by the additional substrate layer is greater than an absorption for millimeter band electromagnetic waves by the substrate; and a refractive index for millimeter band electromagnetic waves by the additional substrate layer is greater than a refractive index for millimeter band electromagnetic waves by the substrate. A scattering layer typically produces a reflection of the upward (i.e., along the direction away from the substrate) of the backward lobe of the slot antenna, which creates a physical process of phase cancellation with the upward radiated energy of the forward lobe of the backward lobe of the slot antenna, causing a reduction in the forward radiation efficiency of the array substrate. However, the solution shown in FIG. 15 is able to reduce the upward (i.e., along the direction away from the substrate) reflection of the backward lobe of the slot antenna and improve the radiation efficiency of the antenna.

Figure 16:
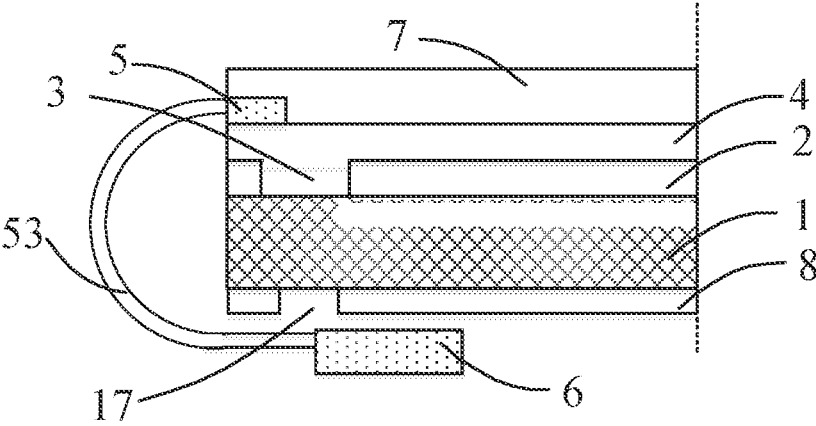
FIG. 16 is a schematic view of a cross-section of an array substrate according to an embodiment of the disclosure.

FIG. 16 shows a schematic cross-sectional view of an array substrate according to an embodiment of the disclosure. As shown in FIG. 6, the array substrate may further comprise an additional opening 17 provided in the heat sink layer, wherein the projection of the additional opening on the substrate overlaps at least partially with the projection of the opening on the substrate. With such additional openings, it is also possible to reduce the upward (i.e., along the direction away from the substrate) reflection of the backward wave wave lobes of the slot antenna and to improve the radiation efficiency of the antenna.

Figure 17:
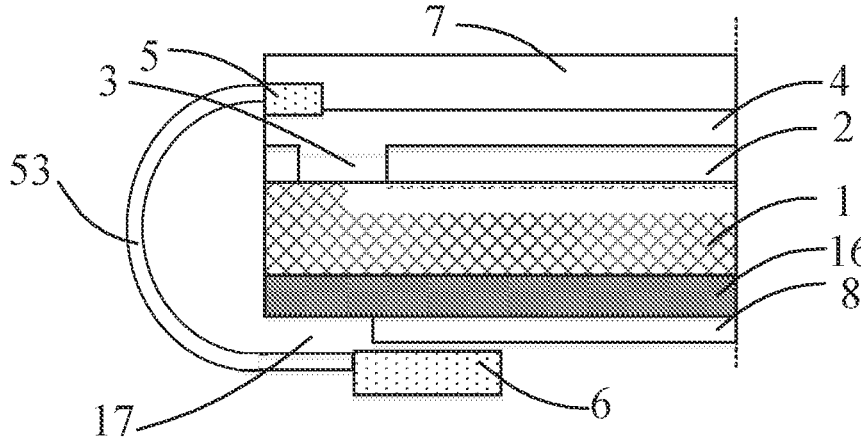
FIG. 17 is a schematic cross-sectional view of an array substrate according to an embodiment of the disclosure.

FIG. 17 shows a schematic cross-sectional view of an array substrate according to an embodiment of the disclosure. As shown in FIG. 17, an additional opening 17 can be provided in the heat sink layer 8 while the additional substrate 16 is provided to the array substrate.

Figure 18:
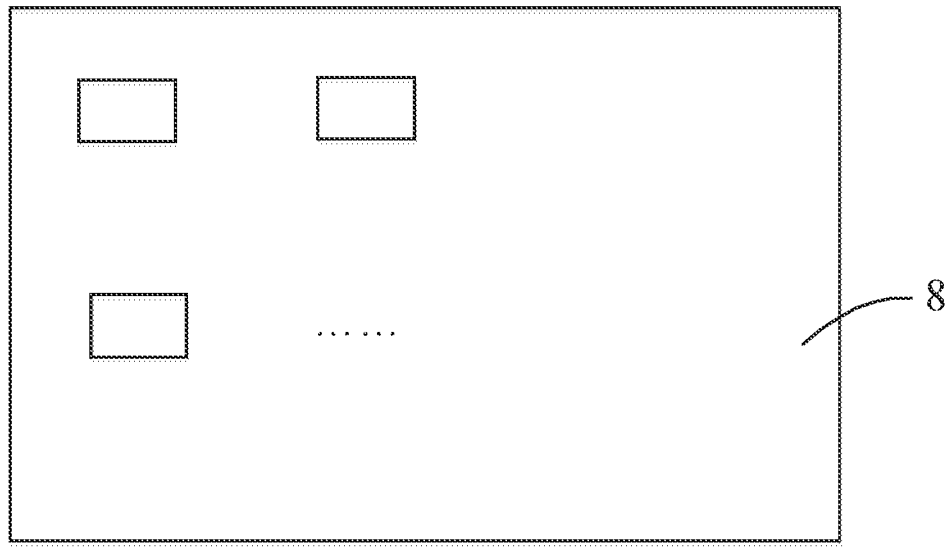
FIG. 18 is a schematic view of a heat sink layer of an array substrate according to the disclosure.

FIG. 18 shows a schematic view of the heat sink layer of the array substrate according to the disclosure. As shown in FIG. 18, an artificial magnetic conductor 18 may be provided on a surface of the heat sink layer of the array substrate facing toward the substrate, the artificial magnetic conductor 18 is used to change the phase of the magnetic field of electromagnetic waves leaving from it without changing the phase of its electric field. The magnetic conductor may be an artificial magnetic surface, a patch resonant unit, etc. With such arrangement, it is possible to not only make the electromagnetic waves reflected from the heat sink layer 8 does not destruct with the forward wave lobe of the antenna, but to form a constructive interference, which can further increase the forward radiation efficiency of the antenna.

Figure 19:
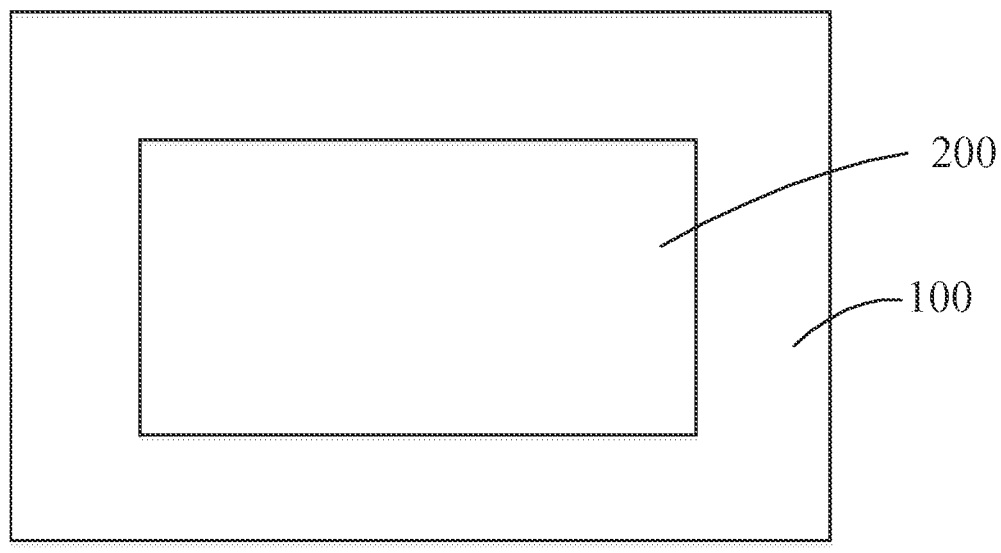
FIG. 19 is a schematic view of a display panel according to an embodiment of the disclosure.

FIG. 19 shows a schematic diagram of a display panel according to the disclosure. As shown in FIG. 19, the display panel 100 according to an embodiment of the disclosure may include an array substrate 200, wherein the array substrate 200 may be an array substrate shown in any one of FIGS. 1-18.

Figure 20:
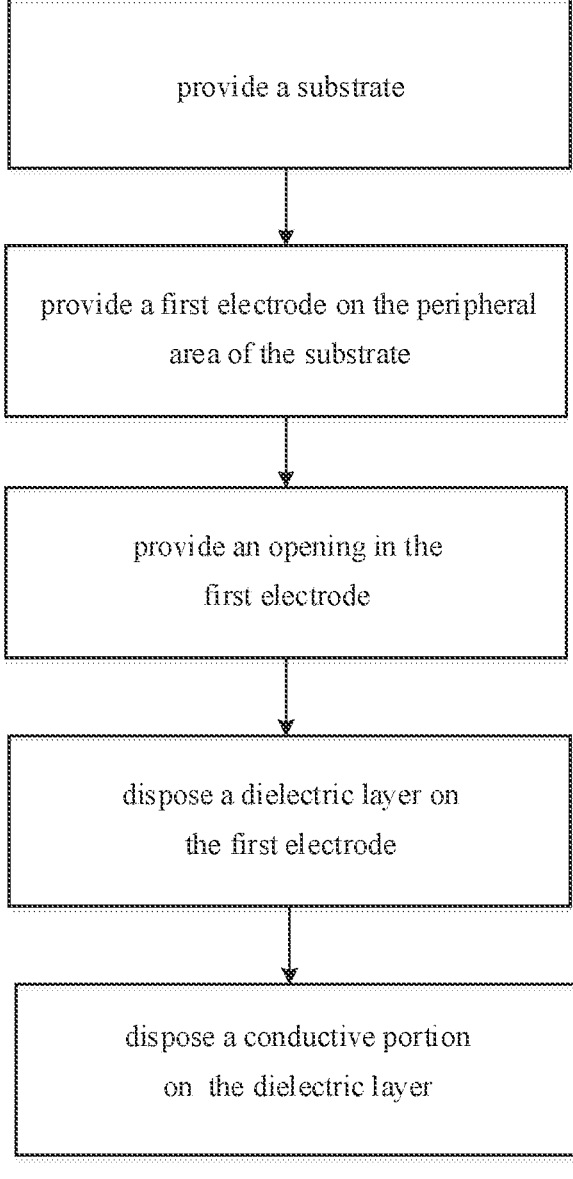
FIG. 20 is a flowchart of a method for manufacturing an array substrate according to the disclosure.

FIG. 20 is a flowchart of a method for manufacturing an array substrate according to the present disclosure text. As shown in FIG. 20, the method for fabricating an array substrate according to an embodiment of the disclosure includes:

S1. providing a substrate, the substrate having a display area and a peripheral area around the display area;

S3. providing a first electrode on the peripheral area of the substrate;

S5. providing an opening in the first electrode, wherein the opening passes through a surface of the first electrode away from the substrate and a surface of the first electrode facing toward the substrate;

S7. providing a dielectric layer on a side of the first electrode away from the substrate; and S9. providing a conductive portion on a side of the dielectric layer away from the substrate.

Having described certain specific embodiments, these embodiments have been presented by way of example only, and are not intended to limit the scope of the present disclosure. Indeed, the novel embodiments described herein may be embodied in various other forms; forms, furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

We claim:

1. An array substrate comprising:
a substrate having a display area and a peripheral area around the display area;
a first electrode disposed on the substrate and in the peripheral area;
an opening disposed in the first electrode, wherein the opening passes through a surface of the first electrode away from the substrate and reaches a surface of the first electrode facing toward the substrate;

a dielectric layer disposed on a side of the first electrode away from the substrate; and a conductive portion disposed on a side of the dielectric layer away from the substrate, and wherein the conductive portion, the dielectric layer and the opening form an antenna, wherein the conductive portion comprises a first sub-conductive portion and a second sub-conductive portion connected to the first sub-conductive portion, wherein a width of the first sub-conductive portion is greater than a width of the second sub-conductive portion, and wherein a projection of the first sub-conductive portion on the substrate overlaps with a projection of the opening on the substrate, and wherein the opening has a first opening portion and a second opening portion, a projection of the first opening portion on the substrate overlaps with a projection of the conductive portion on the substrate, and a projection of the second opening portion on the substrate does not overlap with a projection of the conductive portion on the substrate.

2. The array substrate according to claim 1, wherein the first sub-conductive portion and the second sub-conductive portion are arranged along an extension direction of the first electrode.

3. The array substrate according to claim 1, wherein a width of the opening is between 0 microns~100 microns, wherein a length of the opening is twice a length of the first sub-conductive portion, wherein a distance between a projection of the opening on the substrate to a projection of the second sub-conductive portion on the substrate is less than or equal to a width of the second sub-conductive portion, and wherein a ratio of the width of the first sub-conductive portion to the width of the second sub-conductive portion is between 2~4.

4. The array substrate according to claim 3, wherein the width of the first sub-conductive portion is 120 microns and the width of the second sub-conductive portion is 30 microns.

5. The array substrate according to claim 1, wherein the array substrate comprises at least two openings and at least two conductive portions corresponding to at least two openings, respectively, wherein the at least two conductive portions are electrically connected through corresponding second sub-conductive portions, wherein a distance from a center of one of the at least two the openings to a center of the opening adjacent thereto is between 4 mm~10 mm.

6. The array substrate according to claim 5, further comprising: an RF control circuit disposed on a surface of the substrate opposite a surface of the substrate on which the first electrode is provided; and a feed line connected to the conductive portion, the feed line being used to electrically connect the conductive portion and the RF control circuit.

7. The array substrate according to claim 6, wherein the substrate further comprises a bonding area disposed in the peripheral area, wherein the feed line extends to the bonding area.

8. The array substrate according to claim 6, wherein the opening and the bonding area are on a same side of the array substrate.

9. The array substrate according to claim 6, wherein the feed line comprises a coplanar waveguide.

10. The array substrate according to claim 6, wherein the at least two conductive portions are on a same side of the feed line, or the at least two conductive portions are on different sides of the feed line.

11. The array substrate according to claim 1, wherein a distance from the opening to a side of the first electrode away from the display area is greater than 100 microns, and a distance from the opening to a side of the first electrode facing toward the display area is greater than 100 microns.

12. The array substrate according to claim 1, further comprising:

at least one pixel unit disposed in the display area;

a common electrode disposed on the at least one pixel unit, wherein the first electrode and the common electrode are electrically connected;

a first conductive layer disposed on the first electrode, wherein the opening exposes a surface of the first conductive layer away from the substrate and a surface of the first conductive layer facing toward the substrate, wherein the common electrode has a first portion and a second portion, a projection of the first portion on the substrate overlaps with a projection of the first conductive layer on the substrate, wherein the first portion is in contact with the first conductive layer, and wherein a thickness of the first portion is greater than or equal to a thickness of the second portion.

13. The array substrate according to claim 1, further comprising:

a first conductive layer disposed on a side of the first electrode away from the substrate, wherein the opening exposes a surface of the first conductive layer away from the substrate and a surface of the first conductive layer facing toward the substrate, the pixel unit further comprises an anode disposed between the substrate and the common electrode, wherein the anode and the first conductive layer are disposed in the same layer, and wherein a thickness of the first conductive layer is greater than or equal to a thickness of the anode.

14. The array substrate according to claim 5, wherein the at least two openings comprise two or more groups of openings, wherein conductive portions corresponding to openings in a same group of openings are connected to a same feed line, and conductive portions corresponding to different groups of openings are connected to different feed lines.

15. The array substrate according to claim 5, wherein the at least two openings comprise a first sub-opening set and a second sub-opening set, wherein the first sub-opening set is on a first side of the array substrate and the second sub-opening set is on a second side of the array substrate adjacent to the first side, wherein the conductive portions corresponding to the first sub-opening set and the conductive portions corresponding to the second sub-opening set are electrically connected;

wherein a difference between a distance from the second sub-opening set to the second sub-conductive portion corresponding to the first sub-opening set and a distance from the first opening set to the second sub-conductive portion corresponding to the second sub-opening set is an odd multiple of $\lambda/4$, wherein $\lambda$ is a wavelength of electromagnetic waves with an operating frequency band of the antenna in an equivalent medium of the array substrate.

16. The array substrate according to claim 1, further comprising one of the following (i)~(iii):

(i) a heat sink layer on a surface of the substrate opposite to a surface of the substrate on which the first electrode is provided;

an additional substrate layer between the substrate and the heat sink layer, wherein the additional substrate layer satisfies at least one of the following:

an absorption for millimeter band electromagnetic waves by the additional substrate layer is greater than an absorption for the electromagnetic waves by the substrate; and a refractive index for millimeter band electromagnetic waves by the additional substrate layer is greater than a refractive index for the electromagnetic waves by the substrate;

(ii) a heat sink layer disposed on a surface of the substrate opposite to a surface of the substrate on which the first electrode is provided;

an additional opening in the heat sink layer, wherein a projection of the additional opening on the substrate overlaps at least partially with a projection of the opening on the substrate; or (iii) a heat sink layer on a surface of the substrate opposite to a surface of the substrate on which the first electrode is provided, wherein the heat sink layer is provided with an artificial magnetic conductor on a surface facing toward the substrate, and wherein the artificial magnetic conductor is used to change a phase of a magnetic field of electromagnetic waves leaving therefrom while stabilizing a phase of its electric field.

17. A display panel comprising an array substrate according to claim 1.

18. A method for manufacturing an array substrate comprising:

providing a substrate, the substrate having a display area and a peripheral area around the display area;

providing a first electrode on the peripheral area of the substrate;

providing an opening in the first electrode, wherein the opening passes through a surface of the first electrode away from the substrate and a surface of the first electrode facing toward the substrate;

providing a dielectric layer on a side of the first electrode away from the substrate; and providing a conductive portion on a side of the dielectric layer away from the substrate, wherein the conductive portion comprises a first sub-conductive portion and a second sub-conductive portion connected to the first sub-conductive portion, wherein a width of the first sub-conductive portion is greater than a width of the second sub-conductive portion, and wherein a projection of the first sub-conductive portion on the substrate overlaps with a projection of the opening on the substrate, and wherein the opening has a first opening portion and a second opening portion, a projection of the first opening portion on the substrate overlaps with a projection of the conductive portion on the substrate, and a projection of the second opening portion on the substrate does not overlap with a projection of the conductive portion on the substrate.

* * * * *